(12) United States Patent
Li et al.

(10) Patent No.: US 10,879,275 B2
(45) Date of Patent: Dec. 29, 2020

(54) PIXEL STRUCTURE

(71) Applicant: E Ink Holdings Inc., Hsinchu (TW)

(72) Inventors: Ji-Yuan Li, Hsinchu (TW); Ian French, Hsinchu (TW); San-Long Lin, Hsinchu (TW); Kuang-Heng Liang, Hsinchu (TW); Shu-Fen Tsai, Hsinchu (TW); Jia-Hung Chen, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 88 days.

(21) Appl. No.: 16/403,636

(22) Filed: May 6, 2019

(65) Prior Publication Data

US 2019/0267403 A1    Aug. 29, 2019

Related U.S. Application Data

(63) Continuation of application No. 15/649,614, filed on Jul. 13, 2017, now abandoned.

(30) Foreign Application Priority Data

Oct. 19, 2016  (CN) .......................... 2016 1 0907122

(51) Int. Cl.
| | |
|---|---|
| *H01L 27/12* | (2006.01) |
| *G02F 1/1362* | (2006.01) |
| *G02F 1/1333* | (2006.01) |
| *G02F 1/1343* | (2006.01) |

(52) U.S. Cl.
CPC .......... *H01L 27/124* (2013.01); *G02F 1/1362* (2013.01); *G02F 1/133345* (2013.01); *G02F 1/134363* (2013.01); *G02F 2201/123* (2013.01); *G02F 2201/128* (2013.01)

(58) Field of Classification Search
None
See application file for complete search history.

(56) References Cited

U.S. PATENT DOCUMENTS

| | | | |
|---|---|---|---|
| 5,654,731 | A | 8/1997 | Stewart et al. |
| 6,341,003 | B1 | 1/2002 | Ashizawa et al. |
| 6,912,033 | B2 | 6/2005 | Ashizawa et al. |
| 8,902,390 | B2 | 12/2014 | Hirosawa |
| 2006/0231838 | A1 | 10/2006 | Kim |
| 2007/0171320 | A1 | 7/2007 | Lin |

(Continued)

FOREIGN PATENT DOCUMENTS

| | | |
|---|---|---|
| CN | 102176462 A | 9/2011 |
| CN | 205450519 U | 8/2016 |

(Continued)

OTHER PUBLICATIONS

Corresponding Taiwanese office action dated May 19, 2017.
Corresponding Chinese office action dated Jun. 5, 2019.

*Primary Examiner* — Alexander G Ghyka
(74) *Attorney, Agent, or Firm* — CKC & Partners Co., LLC

(57) ABSTRACT

A pixel structure includes a pixel electrode, a data selection line and an isolation line. The isolation line is disposed along the pixel electrode. The pixel electrode is configured to store a pixel voltage. The data selection line is configured to transmit a data signal. The isolation line is configured to reduce an influence of an electric field of the data signal on the pixel voltage of the pixel electrode. A projection area of the isolation line is overlapped with a projection area of the pixel electrode.

9 Claims, 3 Drawing Sheets

(56) References Cited

U.S. PATENT DOCUMENTS

| | | |
|---|---|---|
| 2008/0036931 A1 | 2/2008 | Chan et al. |
| 2009/0225250 A1* | 9/2009 | Lyu .................. G02F 1/134363 349/44 |
| 2012/0086686 A1 | 4/2012 | Sasaki et al. |
| 2012/0154699 A1 | 6/2012 | Yu et al. |
| 2012/0229438 A1 | 9/2012 | Fujita |
| 2012/0313881 A1 | 12/2012 | Ge et al. |
| 2013/0314636 A1 | 11/2013 | Chen et al. |
| 2014/0267962 A1* | 9/2014 | Jung ................ G02F 1/134363 349/33 |
| 2014/0285478 A1 | 9/2014 | Ono |
| 2015/0029448 A1 | 1/2015 | Hirosawa et al. |
| 2015/0234244 A1 | 8/2015 | Tsuchiya et al. |
| 2016/0062203 A1 | 3/2016 | Ono et al. |
| 2016/0116809 A1* | 4/2016 | Jung ................ G02F 1/136286 349/44 |
| 2016/0246086 A1 | 8/2016 | Woo et al. |
| 2017/0192314 A1* | 7/2017 | Huh ................ G02F 1/136286 |
| 2017/0205655 A1* | 7/2017 | Li ........................ H01L 27/1248 |
| 2017/0285393 A1* | 10/2017 | Kim ........................ H01L 29/24 |
| 2019/0302815 A1* | 10/2019 | Tanaka ................ H03K 17/687 |

FOREIGN PATENT DOCUMENTS

| | | |
|---|---|---|
| TW | 200712610 A | 4/2007 |
| TW | I435153 B | 4/2014 |
| WO | 2012118513 A1 | 9/2012 |
| WO | 2014050672 A1 | 4/2014 |

\* cited by examiner

PIXEL STRUCTURE

RELATED APPLICATIONS

This is a Continuation Application of the U.S. application Ser. No. 15/649,614, filed Jul. 13, 2017, which claims priority to Chinese Application Serial Number 201610907122.8, filed Oct. 19, 2016, which is herein incorporated by reference.

BACKGROUND

Technical Field

The present invention relates to a pixel technology. More particularly, the present invention relates to a pixel structure.

Description of Related Art

In a large panel, in order to reduce a width of a frame, a number of data selection lines are increased, which result in too large distances between pixels. A bridge connection is used to increase areas of pixel electrodes and reduce the distances between the pixels. However, induced electric fields of the data selection lines affect the pixel electrodes, and thus reduce display quality of the pixels.

SUMMARY

An aspect of the present disclosure is to provide a pixel structure including a pixel electrode, a data selection line and an isolation line. The isolation line is disposed along the pixel electrode. The pixel electrode is configured to store a pixel voltage. The data selection line is configured to transmit a data signal. The isolation line is configured to reduce an influence of an electric field of the data signal on the pixel voltage of the pixel electrode. A projection area of the isolation line is overlapped with a projection area of the pixel electrode.

In an embodiment of the present disclosure, the pixel electrode includes a first electrode and a second electrode. The second electrode is electrically coupled to the first electrode. A projection area of the isolation line is overlapped with a projection area of the second electrode.

In sum, the present disclosure can reduce the influence of the electric field of the data signal on the pixel electrodes (especially second electrodes) by using the isolation lines coupled to a fixed voltage (e.g., a ground terminal). Therefore, the mura phenomenon can be reduced, and the display quality of the pixel structures is effectively improved.

It is to be understood that both the foregoing general description and the following detailed description are by examples, and are intended to provide further explanation of the invention as claimed.

BRIEF DESCRIPTION OF THE DRAWINGS

The invention can be fully understood by reading the following detailed description of the embodiment, with reference made to the accompanying drawings as follows.

DETAILED DESCRIPTION

In order to make the description of the disclosure more detailed and comprehensive, reference will now be made in detail to the accompanying drawings and the following embodiments. However, the provided embodiments are not used to limit the ranges covered by the present disclosure; orders of step description are not used to limit the execution sequence either. Any devices with equivalent effect through rearrangement are also covered by the present disclosure.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise indicated, all numbers expressing quantities, conditions, and the like in the instant disclosure and claims are to be understood as modified in all instances by the term "about." The term "about" refers, for example, to numerical values covering a range of plus or minus 20% of the numerical value. The term "about" preferably refers to numerical values covering range of plus or minus 10% (or most preferably, 5%) of the numerical value. The modifier "about" used in combination with a quantity is inclusive of the stated value.

In this document, the term "coupled" may also be termed as "electrically coupled," and the term "connected" may be termed as "electrically connected." "Coupled" and "connected" may also be used to indicate that two or more elements cooperate or interact with each other.

Figure 1:
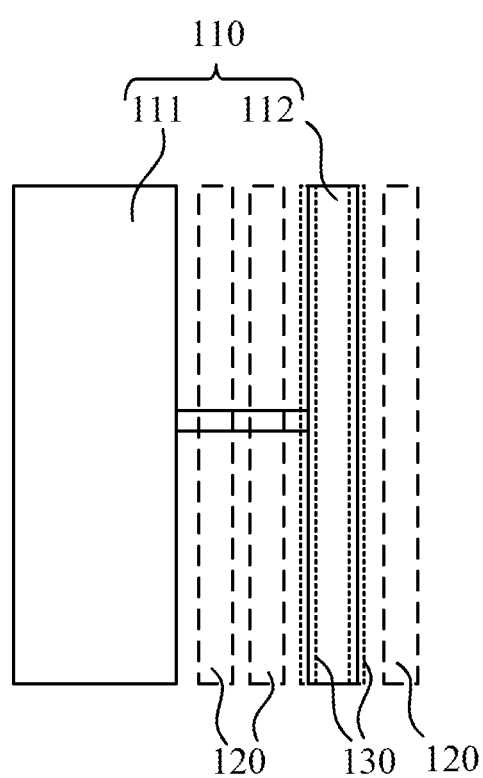
FIG. 1 is a schematic top view of a pixel structure according to an embodiment of the present disclosure.

Reference is made to FIG. 1. FIG. 1 is a schematic top view of a pixel structure 100 according to an embodiment of the present disclosure. The pixel structure 100 includes a pixel electrode 110, at least one data selection line 120, and at least one isolation line 130. The isolation line 130 is disposed along the pixel electrode 110, and a projection area of the isolation line 130 is overlapped with a projection area of the pixel electrode 110. The data selection line 120 is configured to transmit a data signal for displaying pixels.

Specifically, the pixel electrode 110 includes electrodes 111 and 112, in which the electrode 112 is electrically coupled to the electrode 111. In an embodiment, the electrode 112 is electrically coupled to the electrode 111 through a bridge connection. In the present embodiment, the number of the data selection lines 120 that transmit the data signals is three. In order to reduce the distance between the pixel structure 100 and an adjacent pixel structure, the electrode 112 is disposed to increase an overall area of the pixel electrode 110. However, an electric field generated by the data signal that is transmitted by the data selection line 120 may affect the electrode 112, thus reducing the display quality of the pixels (e.g., mura phenomenon occurs).

With respect to the above problems, the isolation line 130 (e.g., a metal data selection line) is configured to reduce an influence of the electric field of the data signal transmitted in the data selection line 120 on the pixel electrode 110. Specifically, the isolation line 130 may be electrically coupled to a fixed voltage level (e.g., a ground terminal), thereby effectively reducing the influence of the electric field of the data signal transmitted in the data selection line 120 on the pixel electrode 110 (especially the electrode 112).

Figure 2:
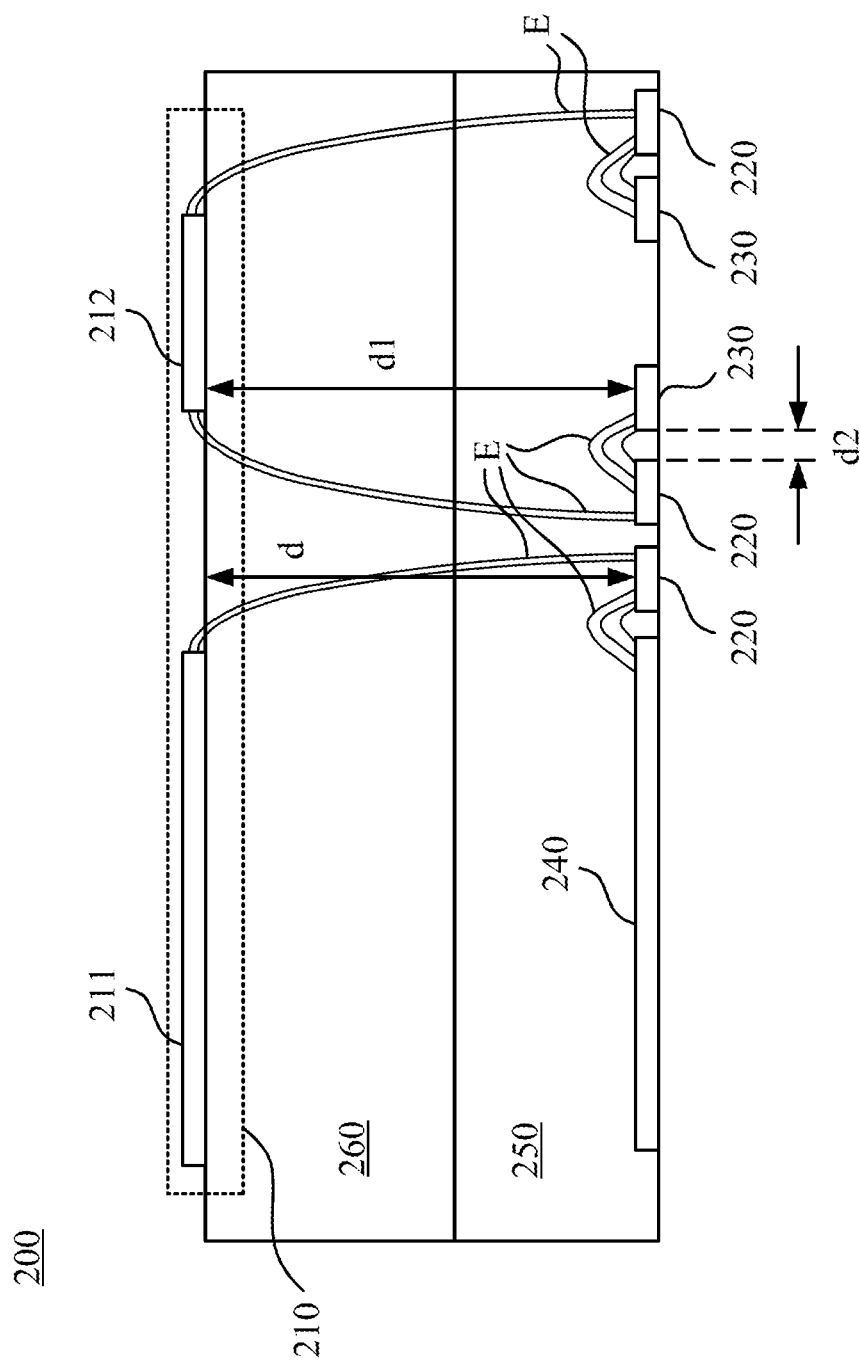
FIG. 2 is a schematic cross-sectional diagram of a pixel structure according to an embodiment of the present disclosure.
Figure 3:
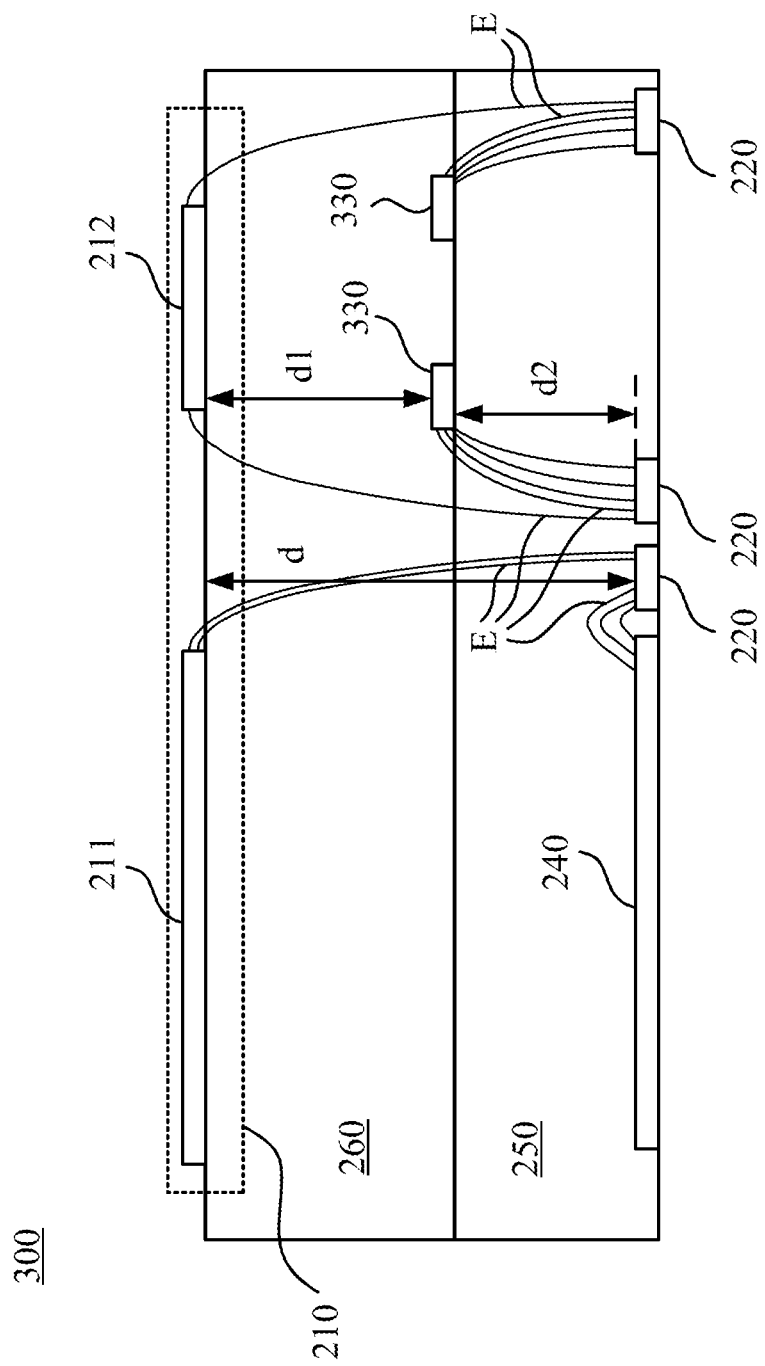
FIG. 3 is a schematic cross-sectional diagram of a pixel structure according to an embodiment of the present disclosure.

For further describing the position of the isolation line 130 in the pixel structure 100, reference is made to FIGS. 2 and 3. FIGS. 2 and 3 are schematic cross-sectional diagrams of pixel structures 200 and 300 according to some embodiments of the present disclosure.

In an embodiment, as shown in FIG. 2, an isolation line 230, a data selection line 220, and a common electrode 240 are disposed on the same layer (e.g., a first metal layer). The pixel electrode 210 (including electrodes 211 and 212) is disposed at a third metal layer, and semiconductor layers 250 and 260 are disposed between the pixel electrode 210 and the data selection line 220 (and the isolation line 230). Because of the arrangement of the isolation line 230, the influence of an electric field E on the electrodes 211 and 212 is effectively reduced, in which the electric field E is generated when the data selection line 220 transmits the data signal.

Alternatively, in another embodiment, as shown in FIG. 3, the data selection line 220 and the common electrode 240 are disposed at the first metal layer. The isolation line 330 is disposed at a second metal layer, and the semiconductor layer 250 is disposed between the isolation line 330 and the data selection line 220. The pixel electrode 210 (including the electrodes 211 and 212) is disposed at the third metal layer, and the semiconductor layer 260 is disposed between the pixel electrode 210 and the isolation line 330. In other words, the isolation line 330 is disposed between the data selection line 220 and the pixel electrode 210. Similarly, because of the arrangement of the isolation line 330, the influence of an electric field E on the electrodes 211 and 212 is effectively reduced, in which the electric field E is generated when the data selection line 220 transmits the data signal.

In order to describe effect of improving the display quality of the pixels by disposing the isolation lines 130, 230 and 330, reference is made to table 1. In different gray level and temperature conditions, the pixel structures 100, 200 and 300 with the isolation lines 130, 230 and 330 have lower optical values L*. It should be noted that the optical value L* is a contrast ratio of a pixel and an adjacent pixel, and the lower optical value L* indicates the better display quality of the pixel. Therefore, the pixel structures 100, 200 and 300 with the isolation lines 130, 230 and 330 can effectively resolve the problem of mura.

TABLE 1

| | | Mura (Optical value L*) | | | |
| --- | --- | --- | --- | --- | --- |
| | | Non-local ghosting | | Edge streaking | |
| Gray level | Temperature (° C.) | With isolation line | Without isolation line | With isolation line | Without isolation line |
| GT1 | 10 | 0 | 0.1 | 1.6 | 1.7 |
| | 25 | 0.1 | 0.2 | 1.2 | 1.3 |
| | 35 | 0.2 | 0.3 | 1.4 | 1.8 |
| GT3 | 10 | 0.7 | 1.2 | 3.1 | 3.6 |
| | 25 | 0.6 | 1 | 2.3 | 2.7 |
| | 35 | 0.4 | 0.7 | 1.8 | 1.9 |

TABLE 1-continued

| | | Mura (Optical value L*) | | | |
| --- | --- | --- | --- | --- | --- |
| | | Non-local ghosting | | Edge streaking | |
| Gray level | Temperature (° C.) | With isolation line | Without isolation line | With isolation line | Without isolation line |
| GT5 | 10 | 0.3 | 0.8 | 4.7 | 5 |
| | 25 | 0.9 | 1.5 | 2.6 | 2.8 |
| | 35 | 0.4 | 0.6 | 2.2 | 2.5 |
| GT7 | 10 | 0.3 | 0.7 | 4.1 | 4.5 |
| | 25 | 1 | 1.6 | 3.1 | 3.3 |
| | 35 | 1 | 1.3 | 2.4 | 2.9 |
| GT9 | 10 | −0.3 | 0 | 3.9 | 4.1 |
| | 25 | 1.2 | 1.7 | 3.1 | 3.4 |
| | 35 | 0.8 | 1.2 | 2.5 | 2.7 |
| GT11 | 10 | 0.2 | 0.5 | 2.3 | 2.4 |
| | 25 | 0.8 | 1.2 | 2.5 | 2.7 |
| | 35 | 1.1 | 1.5 | 1.9 | 2.1 |

It should be noted that, in order to effectively isolate influence of the data signal transmitted in the data selection line 220 on the pixel electrode 210, the isolation lines 230 and 330 may be disposed along the pixel electrode 210. Specifically, because the influence of the data selection line 220 on the electrode 212 is greater, and therefore the isolation line 230 may be disposed along the electrode 212 so as to reduce the influence of the electric field E of the data signal transmitted in the data selection line 220.

In a further embodiment, a second distance d2 (e.g., a range between 3 μm to 7 μm) between the isolation line 230 (or the isolation line 330) and the data selection line 220 is smaller than a distance d between the pixel electrode 210 and the data selection line 220. Moreover, a first distance d1 (e.g., a range between 3 μm to 7 μm) between the isolation line 230 (or the isolation line 330) and the pixel electrode 210 is not greater than the distance d between the pixel electrode 210 and the data selection line 220. Moreover, widths or the number of the isolation lines 230 (or the isolation lines 330) may be adjusted according to actual requirements, so as to achieve a good isolation effect from the electric field.

In practice, the isolation lines 130, 230, 330 and the data selection lines 120 and 220 may be metal lines. However, the present disclosure is not limited thereto.

In sum, the present disclosure can reduce the influence of the electric field E of the data signals transmitted in the data selection lines 120 and 220 on the pixel electrodes 110 and 210 (especially electrodes 112 and 212) by using the isolation lines 130, 230 and 330 coupled to the fixed voltage (e.g., ground terminal). Therefore, the mura can be reduced, and the display quality of the pixel structures 100, 200 and 300 is effectively improved.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A pixel structure, comprising:
a pixel electrode disposed on an uppermost layer and configured to store a pixel voltage, wherein the pixel electrode comprises:
   a first pixel electrode; and
   a second pixel electrode directly electrically connected to the first pixel electrode to increase an overall area of the pixel electrode;
a data selection line configured to transmit a data signal; and
an isolation line disposed along the pixel electrode extending in a same direction of the pixel electrode and configured to reduce an influence of an electric field of the data signal on the pixel voltage of the pixel electrode, wherein a projected area of the isolation line is overlapped with a projected area of the second pixel electrode and the projected area of the isolation line does not overlap the first pixel electrode.

2. The pixel structure of claim 1, wherein the isolation line is disposed between the pixel electrode and the data selection line.

3. The pixel structure of claim 1, wherein the isolation line is spaced from the pixel electrode at a first distance, and the first distance is not greater than a distance between the pixel electrode and the data selection line.

4. The pixel structure of claim 3, wherein the first distance is in a range from 3 µm to 7 µm.

5. The pixel structure of claim 1, wherein the isolation line is spaced from the data selection line at a second distance, and the second distance is smaller than a distance between the pixel electrode and the data selection line.

6. The pixel structure of claim 5, wherein the second distance is in a range from 3 µm to 7 µm.

7. The pixel structure of claim 1, wherein the isolation line is electrically coupled to a fixed voltage.

8. The pixel structure of claim 1, wherein the isolation line is electrically coupled to a ground terminal.

9. The pixel structure of claim 1, further comprising a common electrode, wherein the common electrode and the data selection line are disposed on the same layer, and the common electrode and the isolation line and the pixel electrode are disposed on different layer.

* * * * *